(12) United States Patent
Yang et al.

(10) Patent No.: US 10,809,633 B1
(45) Date of Patent: Oct. 20, 2020

(54) OVERLAY CONTROL WITH CORRECTIONS FOR LENS ABERRATIONS

(71) Applicant: GLOBALFOUNDRIES Inc., Grand Cayman (KY)

(72) Inventors: Dongyue Yang, Ballston Lake, NY (US); Cheuk Wun Wong, Malta, NY (US); Xintuo Dai, Rexford, NY (US); Sanggil Bae, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/561,702

(22) Filed: Sep. 5, 2019

(51) Int. Cl.
*G03F 7/20* (2006.01)

(52) U.S. Cl.
CPC ........ *G03F 7/70633* (2013.01); *G03F 7/7085* (2013.01); *G03F 7/70508* (2013.01); *G03F 7/705* (2013.01)

(58) Field of Classification Search
CPC ............... G03F 7/70508; G03F 7/7085; G03F 7/70633; G03F 7/70641; G03F 1/44
USPC .......................................................... 355/55
See application file for complete search history.

(56) References Cited

U.S. PATENT DOCUMENTS

| | | | | |
|---|---|---|---|---|
| 7,180,189 B2 * | 2/2007 | Bowes | ................. | G01B 11/26 257/757 |
| 8,804,100 B2 * | 8/2014 | Fu | ....................... | G03F 7/70641 355/55 |
| 2005/0250025 A1 * | 11/2005 | Yamaguchi | ............... | G03F 1/44 430/30 |
| 2018/0253017 A1 | 9/2018 | Adel et al. | | |

OTHER PUBLICATIONS

Takashi Saito, Hisashi Watanabe, Yoshimitsu Okuda, "Overlay error of fine patterns by lens aberration using modified illumination," Proc. SPIE 3051, Optical Microlithography X, (Jul. 7, 1997).

Hiroshi Nomura, Takashi Sato, "Overlay error due to lens coma and asymmetric illumination dependence on pattern features," Proc. SPIE 3332, Metrology, Inspection, and Process Control for Microlithography XII, (Jun. 8, 1998).

Kaustuve Bhattacharyya, Marc Noot, Hammer Chang, Sax Liao, Ken Chang, Benny Gosali, Eason Su, Cathy Wang, Arie den Boef, Christophe Fouquet, Guo-Tsai Huang, Kai-Hsiung Chen, Kevin Cheng, John Lin, "Multi-wavelength approach towards on-product overlay accuracy and robustness," Proc. SPIE 10585, Metrology, Inspection, and Process Control for Microlithography XXXII, 105851F (Mar. 13, 2018).

(Continued)

*Primary Examiner* — Hung Nguyen
(74) *Attorney, Agent, or Firm* — Thompson Hine LLP; Francois Pagette

(57) ABSTRACT

Structures for detecting and correcting an overlay inaccuracy and methods of detecting and correcting an overlay inaccuracy. An overlay target includes a first plurality of features arranged along a first longitudinal axis in a first line-space pattern having a first line width, and a second plurality of features arranged along a second longitudinal axis in a second line-space pattern having a second line width that is less than the first line width. The second longitudinal axis is aligned substantially parallel to the first longitudinal axis.

4 Claims, 9 Drawing Sheets

(56) References Cited

OTHER PUBLICATIONS

Dr. Paul Hinnen, "YieldStar Metrology System Applications for Advanced Process Control" Proceedings of the Workshop on Characterization and Metrology for 3D CMOS, Apr. 20, 2018 / IMEC, Leuven.
Dongyue Yang et al., "Apparatus and Method for Aligning Integrated Circuit Layers Using Multiple Grating Materials", U.S. Appl. No. 16/188,814, filed Nov. 13, 2018.

\* cited by examiner

OVERLAY CONTROL WITH CORRECTIONS FOR LENS ABERRATIONS

BACKGROUND

The present invention relates to semiconductor device fabrication and integrated circuits and, more specifically, to structures for detecting and correcting an overlay inaccuracy and methods of detecting and correcting an overlay inaccuracy.

Semiconductor devices may be formed from a stack of patterned layers in which each layer may be patterned by a sequence processing steps including deposition of a material, applying a resist to the deposited layer, lithographic exposure of a desired pattern in the resist, and etching portions of the deposited layer exposed by the resist. Overlay in the context of lithography represents the alignment error between two or more layers. Overlay errors may result from varied sources such as systematic bias from fabrication tools, stochastic errors, or sample variations. A lithography tool may employ overlay corrections based on overlay measurements of overlay targets. However, conventional overlay targets are incapable of correcting pattern placement errors arising from lens aberrations in the lithography tool.

Improved structures for detecting and correcting an overlay inaccuracy and methods of detecting and correcting an overlay inaccuracy are needed.

SUMMARY

In an embodiment of the invention, an overlay target includes a first plurality of features arranged along a first longitudinal axis in a first line-space pattern having a first line width, and a second plurality of features arranged along a second longitudinal axis in a second line-space pattern having a second line width that is less than the first line width. The second longitudinal axis is aligned substantially parallel to the first longitudinal axis.

In an embodiment of the invention, a method includes a exposing a resist in a lithography tool to electromagnetic radiation transferred through a lens and a photomask to form a first plurality of features and a second plurality of features that are latent in the resist, and developing the resist to print the first plurality of features and the second plurality of features. After the resist is developed, a pattern placement error is determined from a positional shift of at least one of the second plurality of features in the resist relative to one or more of the first plurality of features in the resist. The pattern placement error is provided to the lithography tool for adjustment of an operating parameter of the lithography tool to compensate for the pattern placement error. The first plurality of features have a first line width, and the second plurality of features have a second line width that is less than the first line width

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
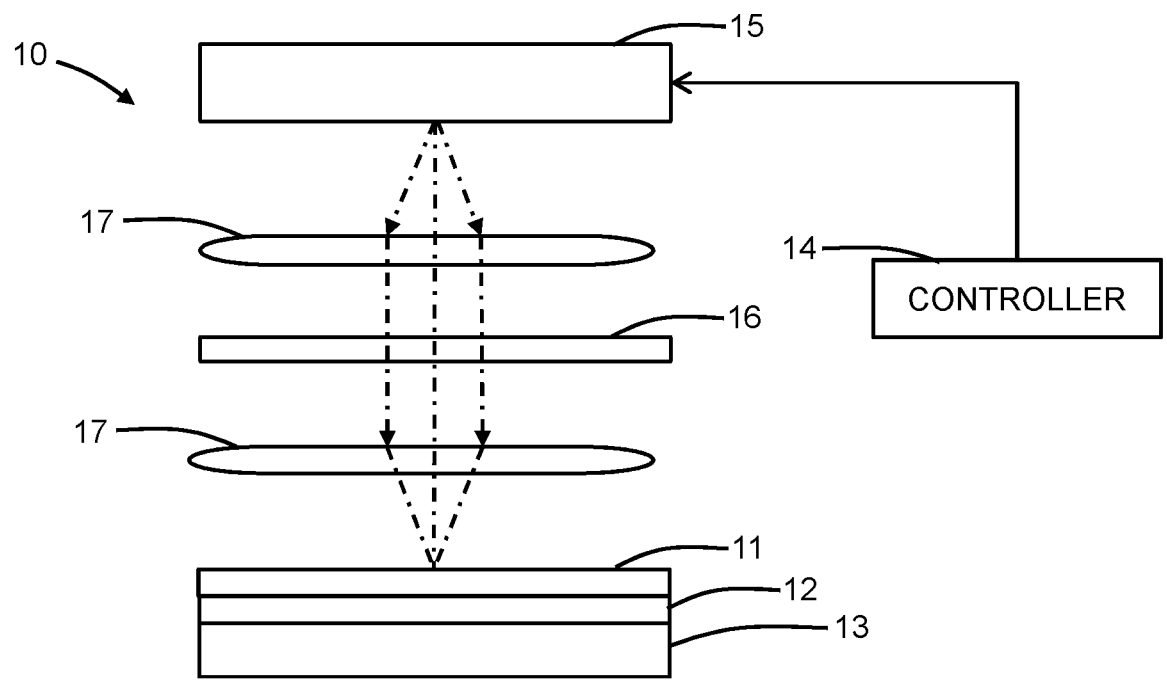
FIG. 1 is a diagrammatic view of a lithography tool and a controller interfaced with the lithography tool for advanced process control with pattern placement error correction in accordance with embodiments of the invention.

With reference to FIG. 1 and in accordance with embodiments of the invention, a lithography tool 10 is configured to expose a resist 11 applied to a layer 12 in order to generate a pattern in the resist 11 that is subsequently used to etch the layer 12. The layer 12 may be located on a substrate 13 and may be one or multiple layers that are patterned to fabricate semiconductor devices using the substrate 13. A controller 14 is coupled to the lithography tool 10 and is configured to control the operation of the lithography tool 10 under advanced process control based in part on the pattern placement error corrections described herein. The controller 14 communicates control parameters and settings to the lithography tool 10 based on feedback and/or feedforward overlay data to maintain overlay errors within a selected tolerance.

The lithography tool 10 may include an illumination source 15 configured to generate a beam of electromagnetic radiation that is directed through a mask, such as a photomask 16, and a set of lenses 17 to the layer 12. The illumination source 15 may be configured, for example, to generate electromagnetic radiation in the ultraviolet radiation band of the electromagnetic spectrum. The photomask 16 may be a reticle that is designed to be stepped in an array around the layer 12 using a stepper or scanner. The lenses 17 may include, for example, one or more condenser lenses arranged between the illumination source 15 and the photomask 16, and one or more projection lenses arranged between the photomask 16 and the layer 12. The lenses 17 introduce aberrations representing deviations from ideal performance based on Fourier optics.

The resist 11 may be composed of a radiation-sensitive material resist that can be patterned using the electromagnetic radiation from illumination source 15 that projected through the photomask 16 and lenses 17. The resist 11 may be applied by a spin coating process and then heated in a soft baking or pre-baking process to drive off excess solvent and to promote partial solidification. In the lithography tool 10, the resist 11 is exposed to the electromagnetic radiation imaged using the photomask 16, baked after exposure, and developed to define residual areas of resist 11 representing printed features covering areas on the contacted surface of the layer 12.

Figure 2:
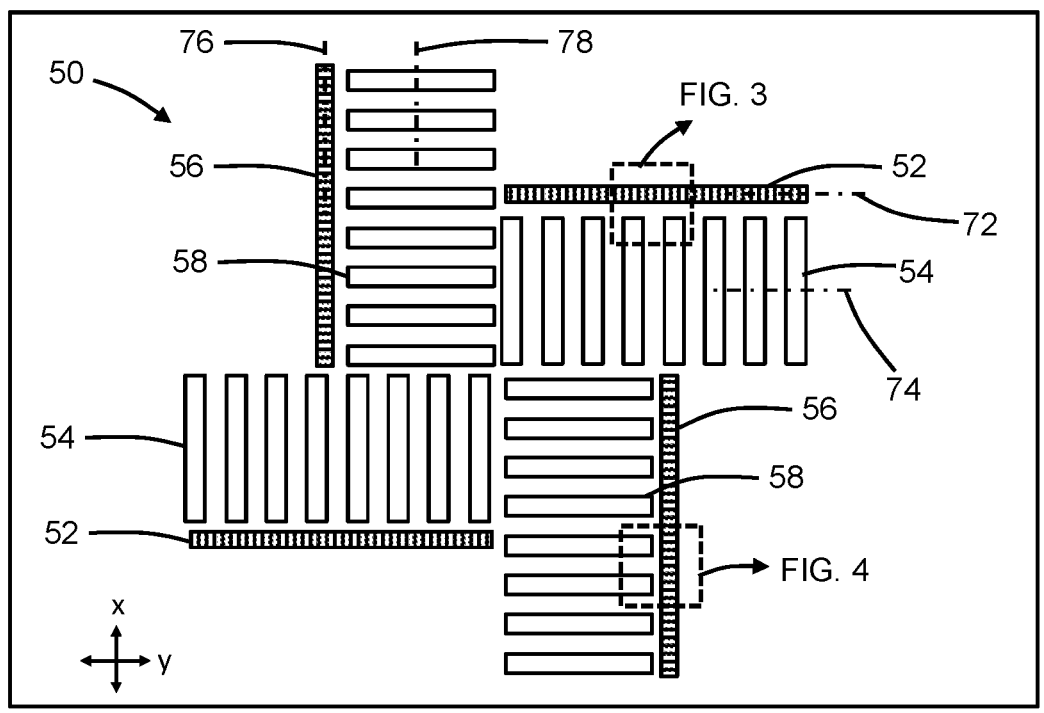
FIG. 2 is a top view of a structure for an overlay mark in accordance with embodiments of the invention.
Figure 3:
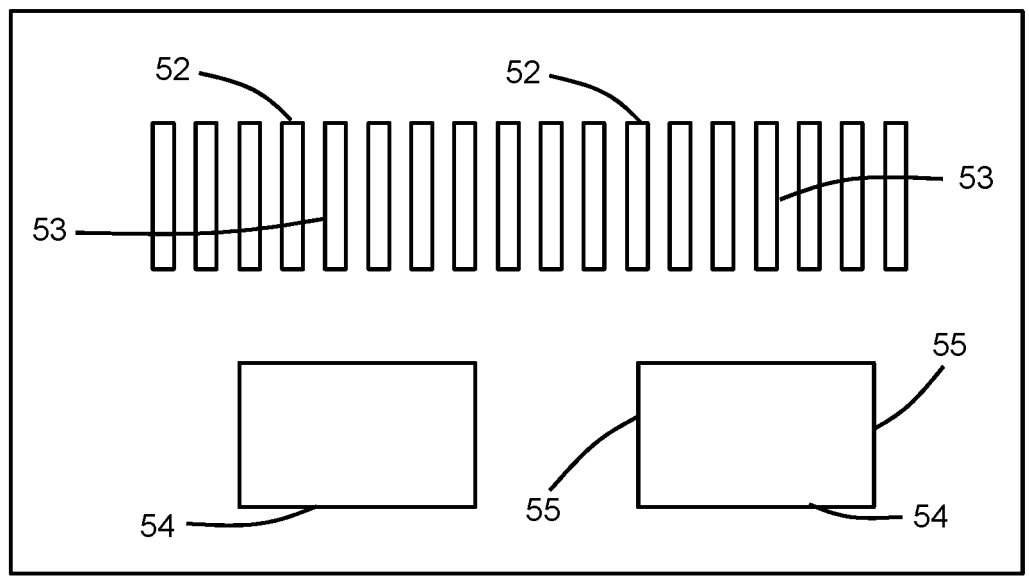
FIG. 3 is an enlarged view of a portion of FIG. 2.
Figure 4:
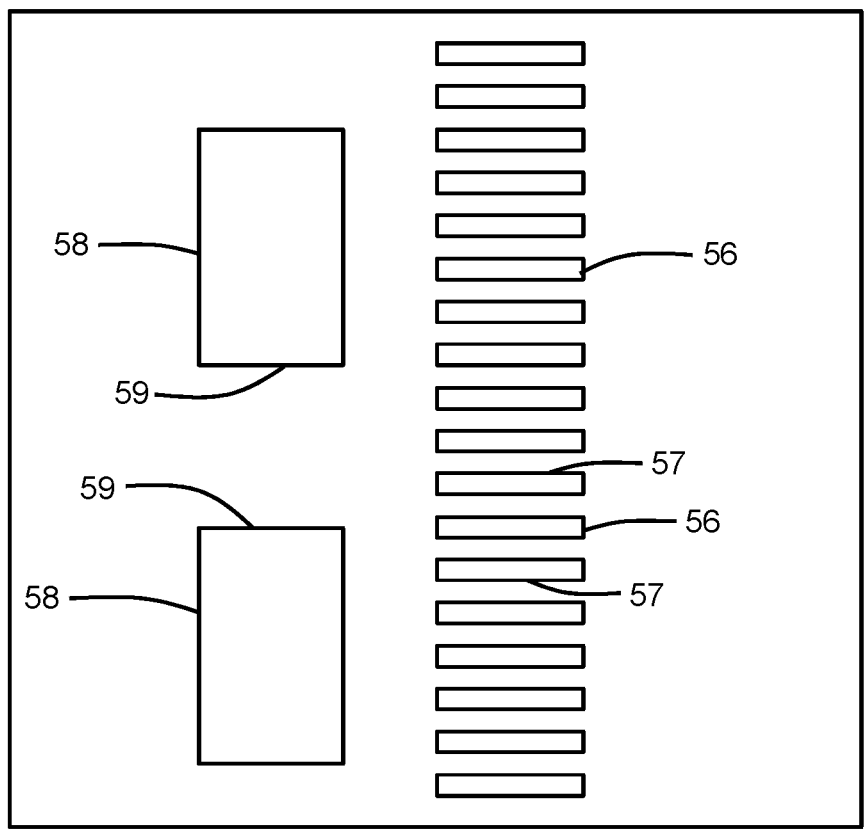
FIG. 4 is an enlarged view of a portion of FIG. 2.

With reference to FIGS. 2, 3, 4 and in accordance with embodiments of the invention, an overlay mark 50 includes sets of features 52, 54, 56, 58 that may be used to determine pattern placement error. The sets of features 52 may be used to determine pattern placement error in one direction (e.g., an x-direction in an x-y plane of a Cartesian coordinate system) in conjunction with the sets of features 54. The sets of features 56 used to determine pattern placement error in another direction (e.g., a y-direction in the x-y plane of the Cartesian coordinate system) in conjunction with the sets of features 58.

Each set of features 52, 54, 56, 58 is arranged in a repeating pattern of lines and spaces with a pitch that is equal to the sum of the line width and space width. The line width of the features 54 is greater than the line width of the features 52, and the line width of the features 58 is greater than the line width of the features 56. For example, the features 52, 56 may be dimensioned with line widths on the order of about five (5) nanometers to about one hundred (100) nanometers, and the features 54, 58 may dimensioned with line widths on the order of about one (1) micrometer to about two (2) micrometers.

The features 52 are arranged along a longitudinal axis 72, and the features 54 are arranged along a longitudinal axis 74 that is parallel or substantially parallel to the longitudinal axis 72. The features 56 are arranged along a longitudinal axis 76, and the features 58 are arranged along a longitudinal axis 78 that is parallel or substantially parallel to the longitudinal axis 76. The features 52 have a pitch that is less than the pitch of the features 54, and the features 56 have a pitch that is less than the pitch of the features 58. The pitch of the features 52 may be equal to the pitch of the features 56, and the pitch of the features 54 may be equal to the pitch of the features 58. Due to their dimensions, the features 52, 56 are not resolved in optical images acquired using an optical metrology tool.

The sets of features 52 are paired in the overlay mark 50 with the sets of features 54 such that one of the sets of features 52 is positioned adjacent to each of the sets of features 54. The features 52 include edges 53 having the same orientation as edges 55 of the features 54. In an embodiment, the edges 53 may be oriented parallel or substantially parallel to the edges 55. Lens aberrations in the lithography tool 10 may cause the position of the edges 53 to shift laterally relative to the edges 55 in the exposed and developed the resist 11. Lens aberrations in the lithography tool 10 may also be a component contributing to lateral positional shifts between the edges 53, 55 in the etched layer 12 following an etching process transferring the resist pattern to the layer 12.

The sets of features 56 are paired in the overlay mark 50 with the sets of features 58 such that one of the sets of features 56 is positioned adjacent to each of the sets of features 58. The features 56 include edges 57 having the same orientation as edges 59 of the features 58. In an embodiment, the edges 57 may be oriented parallel or substantially parallel to the edges 59. Lens aberrations in the lithography tool 10 may cause the position of the edges 57 to shift laterally relative to the edges 59 in the exposed and developed resist 11. Lens aberrations in the lithography tool 10 may also be a component contributing to lateral positional shifts between the edges 57, 59 in the etched layer 12 following the etching process transferring the resist pattern to the layer 12. The positional shift of the edges 57 is transverse to the positional shift of the edges 53 such that, in conjunction with the positional shift of the edges 53, pattern placement error may be assessed in two dimensions within a plane parallel to the plane containing the top surface of the layer 12.

The features 52, 54, 56, 58 may be embodied in portions of the developed resist 11, the features 52, 54, 56, 58 may be embodied in portions of the etched layer 12, or the features 52, 54, 56, 58 may be embodied in portions of the photomask 16 or the design layout. In an embodiment, the features 52, 56 may represent device features, such as semiconductor fins, trenches, or gate electrodes. The features 52, 54, 56, 58 embodied in portions of the photomask 16 or the design layout may be considered to provide a placement reference for the relative positions and registration of the edges 53, 55 and the edges 57, 59. The placement of the features 52, 54, 56, 58 in the developed resist 11 or in the etched layer 12 may include lateral shifts in position of the edges 53 relative to the edges 55 and lateral shifts in position of the edges 57 relative to the edges 59. These lateral shifts in two orthogonal directions provide an indication of the pattern placement error attributable to lens aberrations after the resist 11 is developed, and an indication of the pattern placement error attributable to the etching process and lens aberrations after the layer 12 is etched.

Imaging of the features 52, 54, 56, 58 may be provided by an image-based metrology tool, such as a scanning electron microscope, having a resolution capable of resolving the features 52, 54, 56, 58. The scanning electrode microscope may inspect the features 52, 54, 56, 58 of the overlay mark 50 in the resist 11 or the features 52, 54, 56, 58 of the overlay mark 50 etched in the layer 12 by bombarding the patterned material with primary electrons and detecting secondary electrons emitted from the patterned material in response to the bombardment. The controller 14 may use after-development inspection (ADI) data from the images of the patterned resist 11 for analysis of overlay error and pattern placement error. The controller 14 may use after-etch inspection (AEI) data from the images of the patterned layer 12 for analysis of overlay error and pattern placement error. The ADI data may include one or more distance measurements between the edges 53, 55 in the developed resist 11 indicating shifts in the x-direction, and one or more distance measurements between the edges 57, 59 in the developed resist 11 indicating shifts in the y-direction. Similarly, the AEI data may include one or more distance measurements between the edges 53, 55 in the etched layer 12 indicating shifts in the x-direction, and one or more distance measurements between the edges 57, 59 in the etched layer 12 indicating shifts in the y-direction. The positional shifts are evaluated relative to the reference distances of the comparable edges 53, 55, 57, 59 on the photomask 16 or in the design layout.

Figure 5:
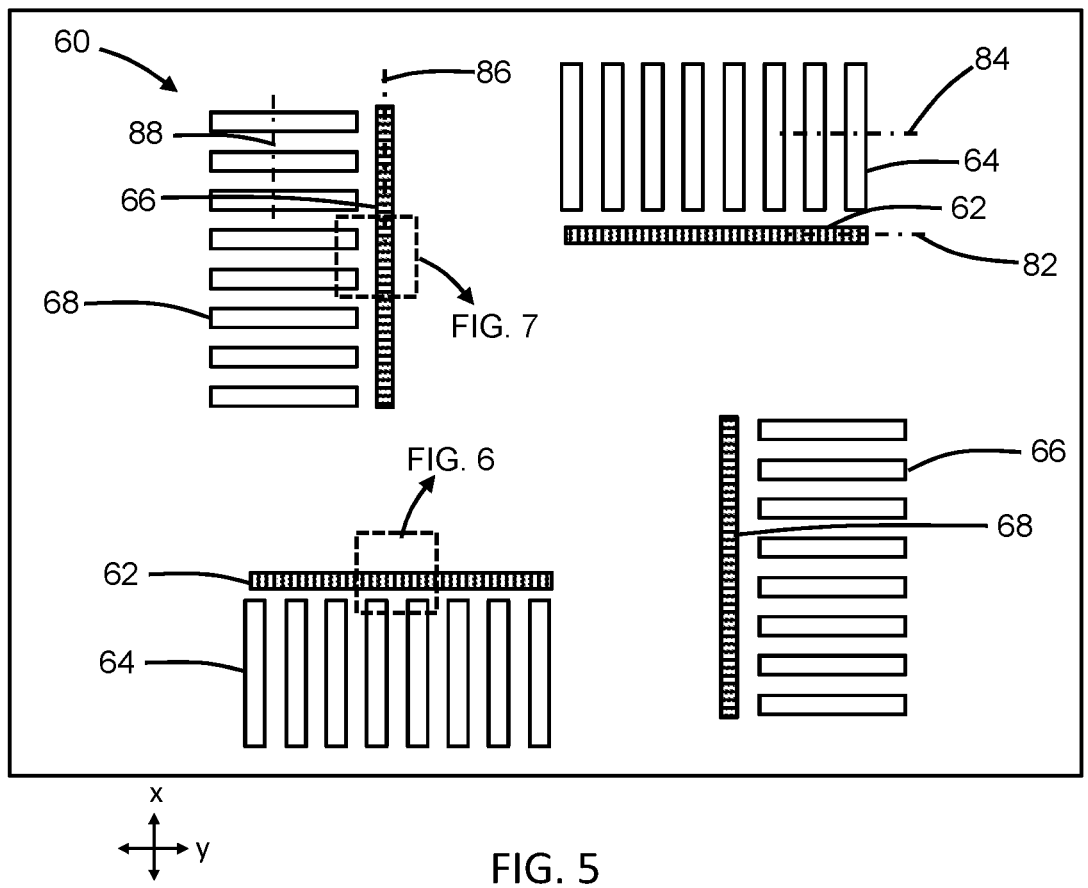
FIG. 5 is a top view of a structure for an overlay mark in accordance with embodiments of the invention.
Figure 6:
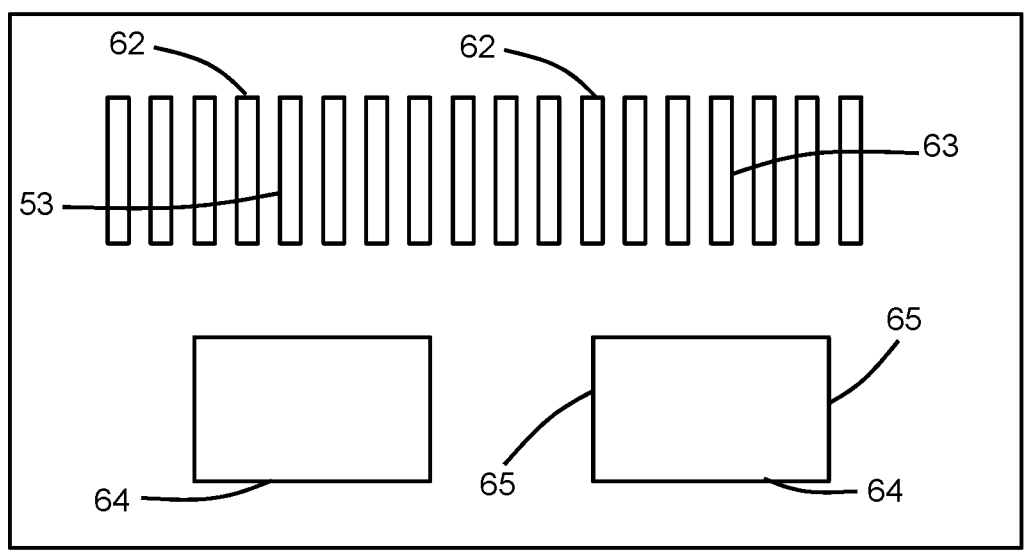
FIG. 6 is an enlarged view of a portion of FIG. 5.
Figure 7:
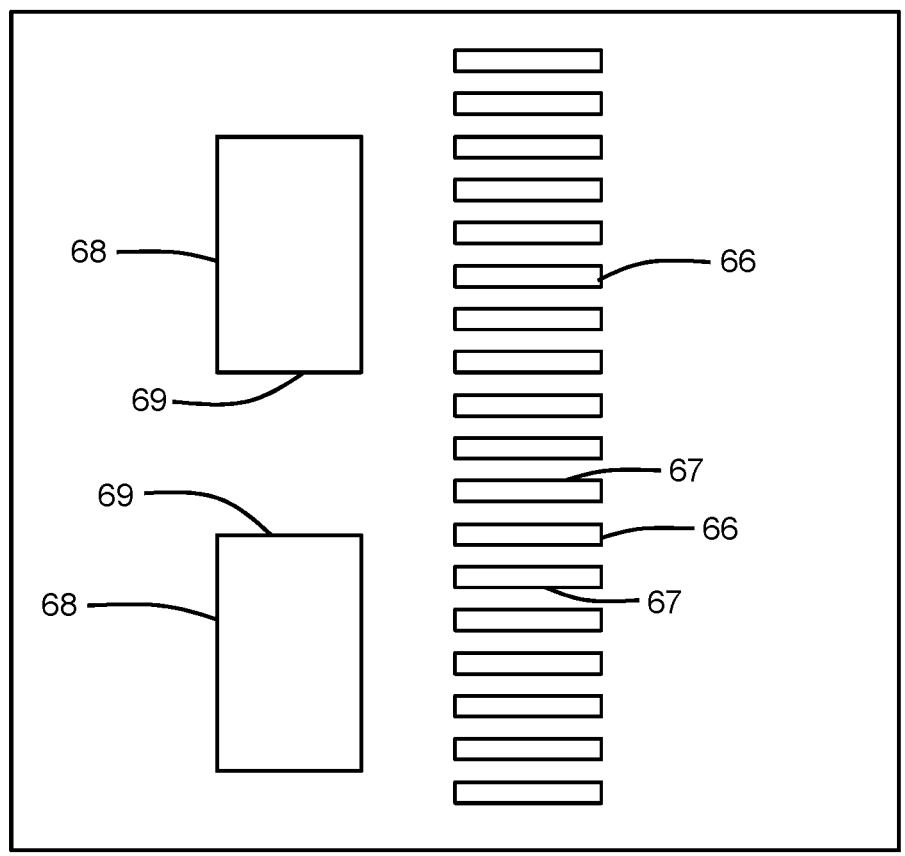
FIG. 7 is an enlarged view of a portion of FIG. 5.

With reference to FIGS. 5, 6, 7 and in accordance with embodiments of the invention, an overlay mark 60 includes sets of features 62, 64, 66, 68 that may also be used to determine pattern placement error. The overlay mark 60 is complementary to the overlay mark 50 (FIGS. 1-3) and may be used to determine overlap and pattern placement errors in a current layer 12 if the overlay mark 50 was used to determine overlap and pattern placement errors in a previous layer 12. The current and previous layers 12 may be successive layers 12 in a stack of patterned layers produced by respective photomasks 16 used to fabricate a semiconductor device.

The features 62, 64, 66, 68 are substantially identical to features 52, 54, 56, 58 with exception of relocated positions for the features 64 relative to features 54 and the features 68 relative to features 58. For example, the features 62 are arranged along a longitudinal axis 82, the features 64 are arranged along a longitudinal axis 84 that is parallel or substantially parallel to the longitudinal axis 82, the features 66 are arranged along a longitudinal axis 86, and the features 68 are arranged along a longitudinal axis 88 that is parallel or substantially parallel to the longitudinal axis 86. The features 62 have a pitch that is less than the pitch of the features 64, and the features 66 have a pitch that is less than the pitch of the features 68. The pitch of the features 62 may be equal to the pitch of the features 66, and the pitch of the features 64 may be equal to the pitch of the features 68. Due to their dimensions, the features 62, 66 are not resolved in optical images acquired using an optical metrology tool.

The features 62, 64, 66, 68 include edges 63, 65, 67, 69 used in the same manner as edges 53, 55, 57, 59 to determine pattern placement error from images acquired after development of the resist and from images acquired after the etching process.

Figure 8:
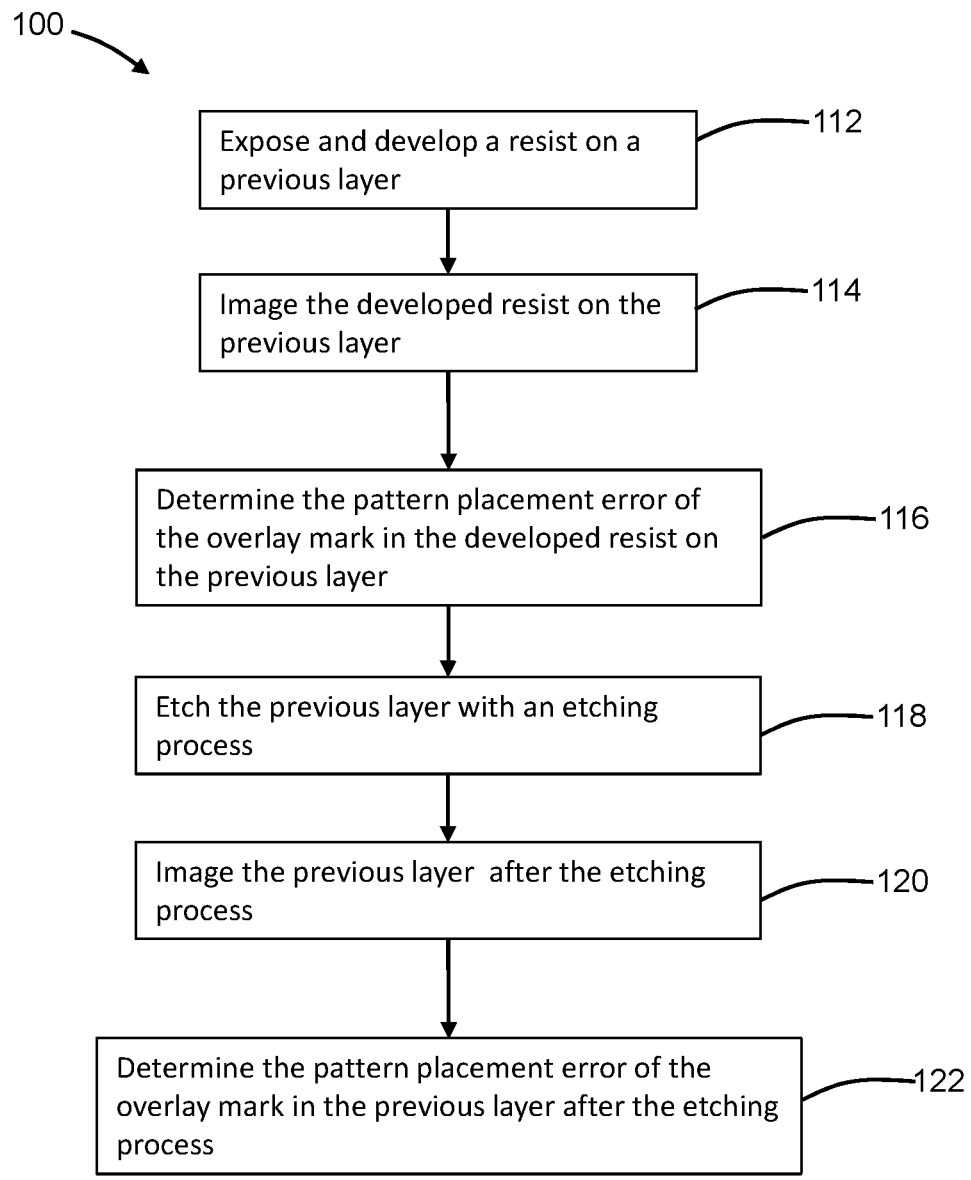
FIG. 8 is a flowchart illustrating a sequence of operations that can be performed by a computer system to determine pattern placement error.

With reference to FIG. 8 and in accordance with embodiments of the invention, a process flow 100 for determining pattern placement error in a previous layer is presented.

In block 112, the resist 11 on a previous layer is exposed by the lithography tool 10, and the exposed resist 11 is developed to form pattern in the resist 11. The overlay mark 50 is printed in the developed resist 11. The previous layer 12 is formed in the lithography tool 10 with the resist 11 exposed using the photomask 16.

In block 114, the developed resist 11 is then imaged using a metrology tool to acquire images of the overlay mark 50 as embodied in the developed resist, and the images may be provided to the controller 14. Images of the features 54, 58 of the overlay mark 60 may also be acquired using an optical metrology tool. Due to their dimensions, the features 52, 56 are not measurable in images acquired using the optical metrology tool.

In block 116, distances between the edges 53, 55 and the edges 57, 59 are measured from the images. The distance between one or more of the edges 53 of the features 52 and one or more of the edges 55 of the features 54 is measured by the controller 14 from the images. The controller 14 compares the measured distance(s) between the edges 53 and the edges 55 with the reference distances on the photomask 16 and/or in the design layout in order to determine a positional shift in one of the orthogonal directions (i.e., the x-direction) in the Cartesian coordinate frame. The distance between one or more of the edges 57 of the features 56 and one or more of the edges 59 of the features 58 is also measured by the controller 14 from the images. The controller 14 compares measured distance(s) between the edges 57 and the edges 59 with the reference distances on the photomask 16 and/or in the design layout in order to determine a positional shift in the other of the orthogonal directions in (i.e., the y-direction) the Cartesian coordinate frame. The positional shifts are an indication of the pattern placement error produced by lens aberrations. The pattern placement error of the previous layer, after resist development, can provided to the lithography tool 10 for adjustment of an operating parameter of the lithography tool 10 to compensate for the pattern placement error. For example, the stepper or scanner of the lithography tool 10 may be adjusted to compensate for the pattern placement error.

In block 118, an etching process is performed in an etching tool in order to transfer the pattern from the patterned resist to the previous layer being patterned. The etching process may be a wet chemical etching process or a dry etching process, such as reactive ion etching, that uses the patterned resist as an etch mask. The resist may be stripped following the etching process. The overlay mark 50 is included in the etched layer.

In block 120, the patterned layer is then imaged using the metrology tool to acquire images of the overlay mark 50 as embodied in the etched layer. Images of the features 54, 58 of the overlay mark 60 may also be acquired using an optical metrology tool.

In block 122, the distance between one or more of the edges 53 of the features 52 and one or more of the edges 55 of the features 54 is measured by the controller 14 from the images of the etched layer. The controller 14 compares the distance(s) between the edges 53 and the edges 55 with the reference distances on the photomask 16 and/or in the design layout in order to determine a positional shift in one of the orthogonal directions (i.e., the x-direction) in the Cartesian coordinate frame. The distance between one or more of the edges 57 of the features 56 and one or more of the edges 59 of the features 58 is measured by the controller 14 from the images. The controller 14 compares the measured distance(s) between the edges 57 and the edges 59 with the reference distances on the photomask 16 and/or in the design layout in order to determine a positional shift in the other of the orthogonal directions in (i.e., the y-direction) the Cartesian coordinate frame.

The positional shifts are indicative of the total pattern placement error including a contribution to the total pattern placement error produced by the etching process and a contribution to the total pattern placement error produced by the lithography process. The pattern placement error produced by lens aberrations may be subtracted from the total pattern placement error to obtain the pattern placement error produced by the etching process alone.

The result of the process flow to this juncture are numerical values for the pattern placement error of a previous layer determined by after-development inspection, and numerical values for the pattern placement error of a previous layer determined by after-etch inspection. The pattern placement error due to lens aberrations alone may be supplied to the lithography tool in order to adjust one or more operating parameters of the lithography tool to compensate for the pattern placement error.

Figure 9:
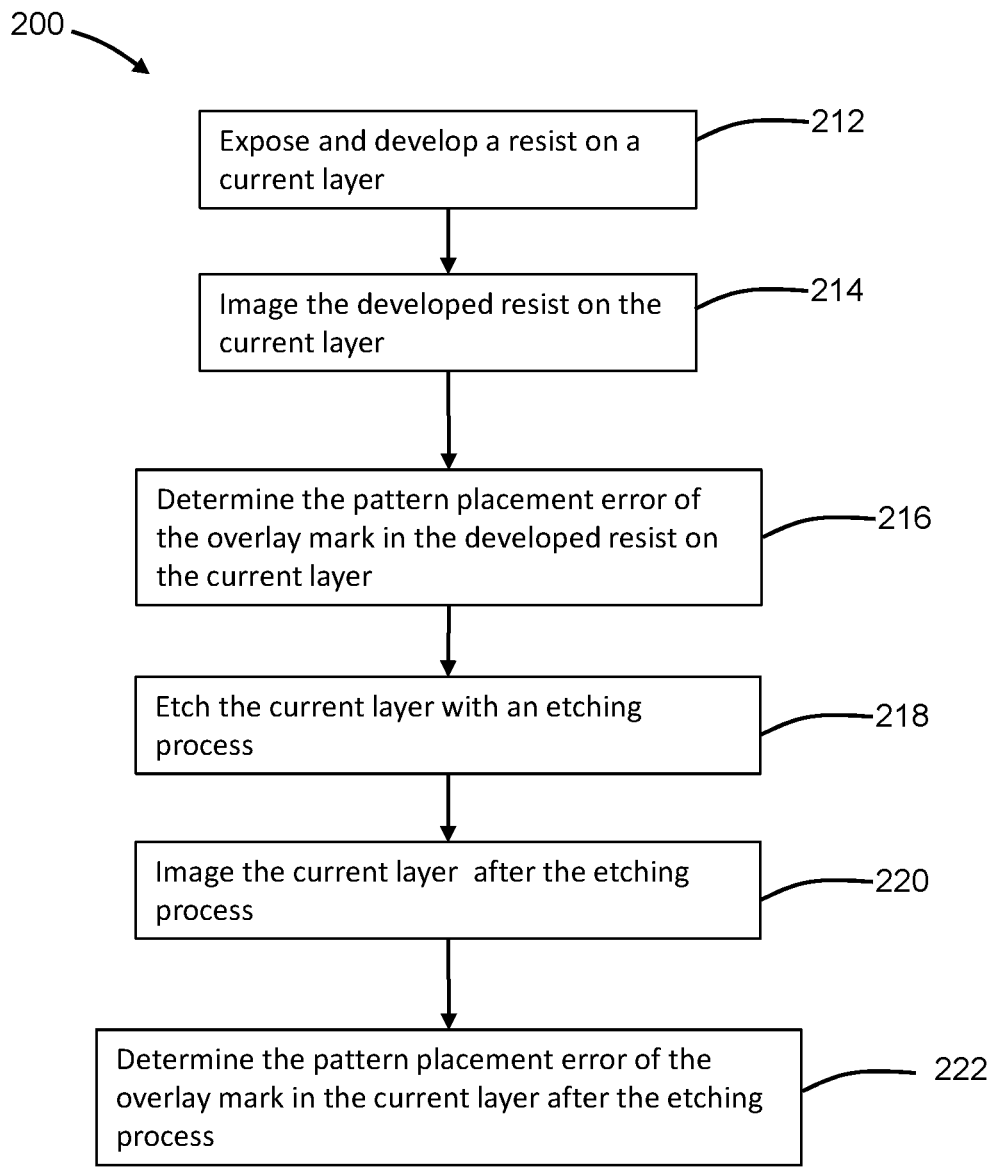
FIG. 9 is a flowchart illustrating a sequence of operations that can be performed by a computer system to determine pattern placement error.

With reference to FIG. 9 and in accordance with embodiments of the invention, a process flow 200 for determining pattern placement error in a current layer is presented.

In block 212, the resist on a current layer is exposed by the lithography tool, and the exposed resist is developed to form pattern in the resist. The overlay mark 60 is included in the patterned resist. The current layer is formed in the lithography tool using a different photomask 16 than used to form the previous layer, and the current layer is formed after the previous layer is formed. Both of the photomasks 16 may belong to a set of photomasks 16 used to fabricate a semiconductor device.

In block 214, the patterned resist is then imaged using the metrology tool to acquire images of the overlay mark 60 as embodied in the developed resist. Images of the features 64, 68 of the overlay mark 60 may also be acquired using an optical metrology tool. Due to their dimensions, the features 62, 66 are not measurable in images acquired using the optical metrology tool.

In block 216, the distance between one or more of the edges 63 of the features 62 and one or more of the edges 65 of the features 64 is measured by the controller 14 from the images. The controller 14 compares these measured distance(s) between the edges 63 and the edges 65 with the reference distances on the photomask 16 and/or in the design layout in order to determine a positional shift in one of the orthogonal directions (i.e., the x-direction) in the Cartesian coordinate frame. The distance between one or more of the edges 67 of the features 66 and the distance between one or more of the edges 69 of the features 68 are measured by the controller 14 from the images. The controller 14 compares these measured distance(s) between the edges 67 and the edges 69 with the reference distances on the photomask 16 and/or in the design layout in order to determine a positional shift in the other of the orthogonal directions in (i.e., the y-direction) the Cartesian coordinate frame. The positional shifts are indicative of the two-dimensional pattern placement error produced by lens aberrations. The pattern placement error of the current layer, after resist development, can provided to the lithography tool 10 for adjustment of an operating parameter of the lithography tool 10 to compensate for the pattern placement error.

In block 218, the etching process is performed in an etching tool in order to transfer the pattern from the patterned resist to the current layer being patterned. The etching process may be a wet chemical etching process or a dry etching process, such as reactive ion etching, that uses the patterned resist as an etch mask. The resist may be stripped following the etching process. The overlay mark 60 is included in the etched layer.

In block 220, the patterned layer is then imaged using the metrology tool to acquire images of the overlay mark 60 as embodied in the etched layer. Images of the features 64, 68 of the overlay mark 60 may also be acquired using an optical metrology tool.

In block 222, the distance between one or more of the edges 63 of the features 62 and one or more of the edges 65 of the features 64 is measured by the controller 14 from the images of the etched layer. The controller 14 compares these measured distance(s) between the edges 63 and the edges 65 with the reference distances on the photomask 16 and/or in the design layout in order to determine a positional shift in one of the orthogonal directions (i.e., the x-direction) in the Cartesian coordinate frame. The distance between one or more of the edges 67 of the features 66 and one or more of the edges 69 of the features 68 is measured by the controller 14 from the images. The controller 14 compares these measured distance(s) between the edges 67 and the edges 69 are compared with the reference distances on the photomask 16 and/or in the design layout in order to determine a positional shift in the other of the orthogonal directions in (i.e., the y-direction) the Cartesian coordinate frame.

The positional shifts are an indication of the total pattern placement error including a contribution to the total pattern placement error produced by the etching process and a contribution to the total pattern placement error produced by the lithography process. The pattern placement error produced by lens aberrations may be subtracted from the total pattern placement error to obtain the pattern placement error produced by the etching process alone. The pattern placement error due to the etching process alone may be supplied to an etch tool in order to adjust one or more operating parameters to compensate for the pattern placement error.

The result of the process flow after this juncture are numerical values for the pattern placement error of a current layer determined by after-development inspection, and numerical values for the pattern placement error of a current layer determined by after-etch inspection.

In block 218, the overlay inaccuracy produced by lens aberrations may be determined by the controller 14 from a difference between the pattern placement error due to lens aberrations of the current layer and the pattern placement error due to lens aberrations of the previous layer. The overlay inaccuracy may be supplied to the lithography tool in order to adjust one or more operating parameters of the lithography tool to compensate for the overlay inaccuracy.

Figure 10:
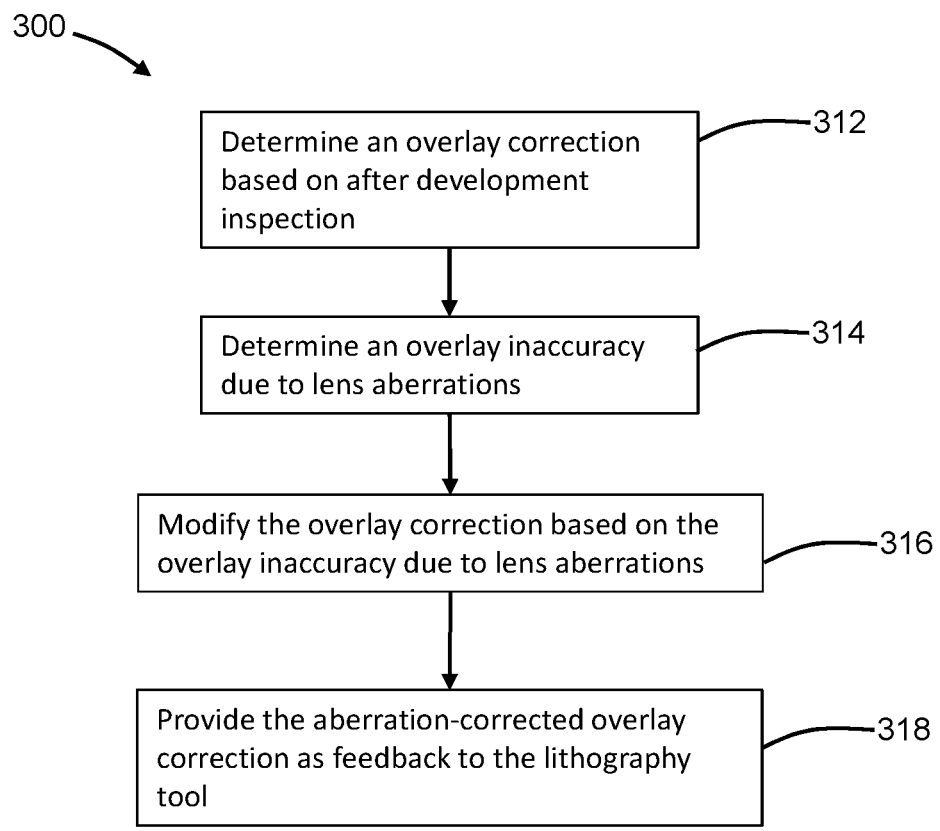
FIG. 10 is a flowchart illustrating a sequence of operations that can be performed by a computer system to determine a corrected overlay error.

With reference to FIG. 10 and in accordance with embodiments of the invention, a process flow 300 for determining an overlay correction is presented.

In block 312, the images of the features 64, 68 of the overlay mark 60 for the current layer after development of the resist and the images of the features 54, 58 of the overlay mark 50 for the previous layer after development of the resist may be compared by the controller 14 to determine an overlay correction based on optical measurements alone. The comparison may entail determining a difference between the location of the feature 54 and the location of the feature 64 based on after development inspection, and a difference between the location of the feature 58 and the location of the feature 68 based on after development inspection.

In block 314, the controller 14 may determine an overlay inaccuracy due to lens aberrations. To that end, the pattern placement error determined from after development inspection of the resist for the current layer may be compared by the controller 14 with the pattern placement error determined by after development inspection of the resist for the previous layer. The comparison may entail determining a difference between the pattern placement error determined from after development inspection of the resist for the current layer and the pattern placement error determined by after development inspection of the resist for the previous layer.

In block 316, the overlay inaccuracy due to lens aberrations determined in block 314 may be used to adjust the overlay correction determined in block 312. In an embodiment, the controller 14 may add the overlay inaccuracy due to lens aberrations and the overlay correction to provide a sum determinative of an aberration-corrected overlay correction based on after development inspection.

In block 318, the aberration-corrected overlay correction may be supplied from the controller 14 as feedback to the lithography tool 10. The aberration-corrected overlay correction is determined independent of the pattern placement errors determined by the after etch inspection. One or more operating parameters of the lithography tool may be adjusted to compensate for the aberration-corrected overlay correction.

Figure 11:
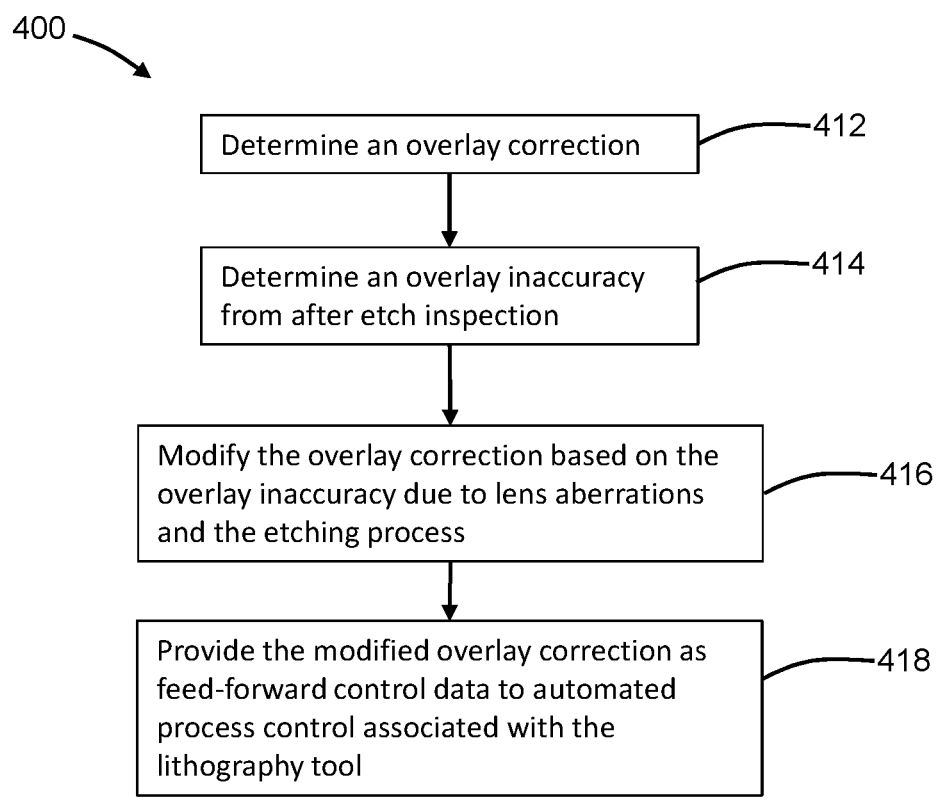
FIG. 11 is a flowchart illustrating a sequence of operations that can be performed by a computer system to determine a corrected overlay error.

With reference to FIG. 11 and in accordance with embodiments of the invention, a process flow 400 for determining an overlay correction is presented.

In block 412, the images of the features 64, 68 of the overlay mark 60 for the current layer after development of the resist and the images of the features 54, 58 of the overlay mark 50 for the previous layer after development of the resist may be compared by the controller 14 to determine an overlay correction based on optical measurements alone. The comparison may entail determining a difference between the locations of the features 54 and the locations of the features 64 based on after development inspection, and a difference between the locations of the features 58 and the locations of the features 68 based on after development inspection.

In block 414, the controller 14 may determine an overlay inaccuracy due to lens aberrations. To that end, the pattern placement error determined from after etch inspection for the current layer may be compared by the controller 14 with the pattern placement error determined by after etch inspection for the previous layer. The comparison may entail determining a difference between the pattern placement error determined from after etch inspection for the current layer and the pattern placement error determined by after etch inspection for the previous layer.

In block 416, the overlay inaccuracy determined in block 414 may be used to adjust the overlay correction determined in block 412. In an embodiment, the controller 14 may add the overlay inaccuracy due to lens aberrations with the overlay correction to provide a sum determinative of an aberration-corrected overlay correction based on after development inspection.

In block 418, the aberration-and-etch-corrected overlay correction may be supplied from the controller 14 as feedforward control data to an automated process control associated with the lithography tool 10.

The pattern placement errors described herein may also be used in a different manner. For example, the pattern placement errors may be used to decompose different error sources for further analysis. Specifically, the pattern placement errors may be decomposed into intrinsic or systematic error sources that are correctable in lithography or the etching process and extrinsic error sources, such as random errors introduced during metrology that are not correctable. In alternative embodiments, the features 52 and 56 may be used in conjunction with the features of diffraction-based overlay marks in order to assess pattern placement errors arising from lens aberrations in the lithography tool 10.

Figure 12:
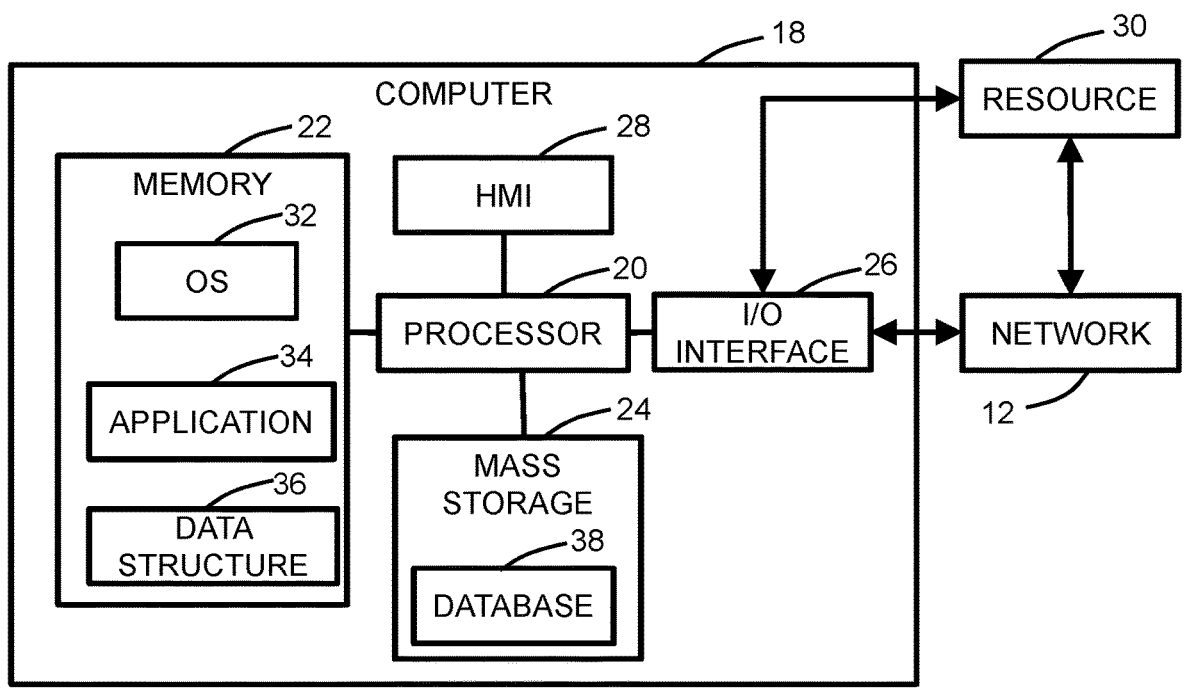
FIG. 12 is a schematic view of an exemplary computer system that may be used to provide the controller of FIG. 1.

With reference to FIG. 12, the controller 14 (FIG. 1) be implemented on one or more computer devices or systems, such as exemplary computer system 18 configured to determine pattern placement error and overlay errors as described herein, and to provide advanced process control with feedback and feed-forward loops to control the lithographic processes being performed by the lithography tool 10 (FIG. 1).

The computer system 18 may include a processor 20, a memory 22, a mass storage memory device 24, an input/output (I/O) interface 26, and a Human Machine Interface (HMI) 28. The computer system 18 may also be operatively coupled to one or more external resources 30 via the I/O interface 26. External resources 30 may include, but are not limited to, servers, databases, mass storage devices, peripheral devices, cloud-based network services, or any other suitable computer resource that may be used by the computer system 18.

The processor 20 may include one or more devices selected from microprocessors, micro-controllers, digital signal processors, microcomputers, central processing units, field programmable gate arrays, programmable logic devices, state machines, logic circuits, analog circuits, digital circuits, or any other devices that manipulate signals (analog or digital) based on operational instructions that are stored in the memory 22. The memory 22 may include a single memory device or a plurality of memory devices including, but not limited to, read-only memory (ROM), random access memory (RAM), volatile memory, non-volatile memory, static random access memory (SRAM), dynamic random access memory (DRAM), flash memory, cache memory, or any other device capable of storing information. The mass storage memory device 24 may include data storage devices such as a hard drive, optical drive, tape drive, non-volatile solid state device, or any other device capable of storing information.

The processor 20 may operate under the control of an operating system 32 that resides in the memory 22. The operating system 32 may manage computer resources so that computer program code embodied as one or more computer software applications, such as an application 34 residing in memory 22, may have instructions executed by the processor 20. In an alternative embodiment, the processor 20 may execute the application 34 directly, in which case the operating system 32 may be omitted. One or more data structures 36 may also reside in memory 22, and may be used by the processor 20, operating system 32, or application 34 to store or manipulate data. The application 34 may include instructions for determining process inputs for controlling an across-wafer profile of a semiconductor process as described herein.

The I/O interface 26 may provide a machine interface that operatively couples the processor 20 to other devices and systems, such as the one or more external resources 30. The application 34 may thereby work cooperatively with the external resources 30 by communicating via the I/O interface 26 to provide the various features, functions, applications, processes, or modules comprising embodiments of the invention. The application 34 may also have program code that is executed by the one or more external resources 30, or otherwise rely on functions or signals provided by other system or network components external to the computer system 18. Indeed, given the nearly endless hardware and software configurations possible, persons having ordinary skill in the art will understand that embodiments of the invention may include applications that are located externally to the computer system 18, distributed among multiple computers or other external resources 30, or provided by computing resources (hardware and software) that are provided as a service over a communication network, such as a cloud computing service.

The HMI 28 may be operatively coupled to the processor 20 of computer system 18 in a known manner to allow a user to interact directly with the computer system 18. The HMI 28 may include video or alphanumeric displays, a touch screen, a speaker, and any other suitable audio and visual indicators capable of providing data to the user. The HMI 28 may also include input devices and controls such as an alphanumeric keyboard, a pointing device, keypads, pushbuttons, control knobs, microphones, etc., capable of accepting commands or input from the user and transmitting the entered input to the processor 20.

A database 38, which may reside on the mass storage memory device 24, may be used to collect and organize data used by the various systems and modules described herein. The database 38 may include data and supporting data structures that store and organize the data. In particular, the database 38 may be arranged with any database organization or structure including, but not limited to, a relational database, a hierarchical database, a network database, or combinations thereof. A database management system in the form of a computer software application executing as instructions on the processor 20 may be used to access the information or data stored in records of the database 38 in response to a query, where a query may be dynamically determined and executed by the operating system 32, other applications 34, or one or more modules.

In general, the routines executed to implement the embodiments of the invention, whether implemented as part of an operating system or a specific application, component, program, object, module or sequence of instructions, or even a subset thereof, may be referred to herein as "computer program code," or simply "program code." Program code typically comprises computer readable instructions that are resident at various times in various memory and storage devices in a computer and that, when read and executed by one or more processors in a computer, cause that computer to perform the operations necessary to execute operations and/or elements embodying the various aspects of the embodiments of the invention. Computer readable program instructions for carrying out operations of the embodiments of the invention may be, for example, assembly language or either source code or object code written in any combination of one or more programming languages.

The program code embodied in any of the applications/modules described herein is capable of being individually or collectively distributed as a program product in a variety of different forms. In particular, the program code may be distributed using a computer readable storage medium having computer readable program instructions thereon for causing a processor to carry out aspects of the embodiments of the invention.

Computer readable storage media, which are inherently non-transitory, may include volatile and non-volatile, and removable and non-removable tangible media implemented in any method or technology for storage of information, such as computer-readable instructions, data structures, program modules, or other data. Computer readable storage media may further include random access memory (RAM), read-only memory (ROM), erasable programmable read-only memory (EPROM), electrically erasable programmable read-only memory (EEPROM), flash memory or other solid state memory technology, portable compact disc read-only memory (CD-ROM), or other optical storage, magnetic cassettes, magnetic tape, magnetic disk storage or other magnetic storage devices, or any other medium that can be used to store the desired information and which can be read by a computer. A computer readable storage medium should not be construed as transitory signals per se (e.g., radio waves or other propagating electromagnetic waves, electromagnetic waves propagating through a transmission media such as a waveguide, or electrical signals transmitted through a wire). Computer readable program instructions may be downloaded to a computer, another type of programmable data processing apparatus, or another device from a computer readable storage medium or to an external computer or external storage device via a communication network.

Computer readable program instructions stored in a computer readable medium may be used to direct a computer, other types of programmable data processing apparatus, or other devices to function in a particular manner, such that the instructions stored in the computer readable medium produce an article of manufacture including instructions that implement the functions/acts specified in the flowcharts, sequence diagrams, and/or block diagrams. The computer program instructions may be provided to one or more processors of a general purpose computer, special purpose computer, or other programmable data processing apparatus to produce a machine, such that the instructions, which execute via the one or more processors, cause a series of computations to be performed to implement the functions and/or acts specified in the flowcharts, sequence diagrams, and/or block diagrams.

In certain alternative embodiments, the functions and/or acts specified in the flowcharts, sequence diagrams, and/or block diagrams may be re-ordered, processed serially, and/or processed concurrently without departing from the scope of the invention. Moreover, any of the flowcharts, sequence diagrams, and/or block diagrams may include more or fewer blocks than those illustrated consistent with embodiments of the invention.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An overlay target comprising:
   a first plurality of features arranged along a first longitudinal axis in a first line-space pattern having a first line width;
   a second plurality of features arranged along a second longitudinal axis in a second line-space pattern having a second line width that is less than the first line width;
   a third plurality of features arranged along a third longitudinal axis in a third line-space pattern having a third line width that is equal to the first line width; and
   a fourth plurality of features arranged along a fourth longitudinal axis in a fourth line-space pattern that is equal to the second line width, wherein the second longitudinal axis is aligned substantially parallel to the first longitudinal axis, the third longitudinal axis is aligned substantially parallel to the fourth longitudinal axis, the third longitudinal axis extends across the first plurality of features, and the fourth longitudinal axis extends across the second plurality of features.

2. The overlay target of claim 1 wherein the first line width ranges from about one micrometer to about two micrometers, and the second line width ranges from about five nanometers to about one hundred nanometers.

3. The overlay target of claim 1 wherein the first line-space pattern of the first plurality of features is periodic with a first pitch, and the second line-space pattern of the second plurality of features is periodic with a second pitch that is less than the first pitch.

4. The overlay target of claim 1 wherein each first feature includes a first edge, each second feature includes a second edge, and the second plurality of features are oriented relative to the first plurality of features such that the first edge of each first feature is aligned substantially parallel to the second edge of each second feature.

* * * * *